United States Patent
Trotman et al.

(10) Patent No.: US 10,426,054 B1
(45) Date of Patent: Sep. 24, 2019

(54) INTEGRATED CARD-GUIDE ADAPTER HEAT SINK

(71) Applicant: Hamilton Sundstrand Corporation, Windsor Locks, CT (US)

(72) Inventors: Alexander Trotman, Manchester, CT (US); Kenneth Trotman, Granby, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 0 days.

(21) Appl. No.: 16/218,130

(22) Filed: Dec. 12, 2018

(51) Int. Cl.
  *H05K 7/14* (2006.01)
  *H05K 7/20* (2006.01)
  *H05K 1/02* (2006.01)
  *G06F 1/18* (2006.01)

(52) U.S. Cl.
  CPC ......... *H05K 7/1425* (2013.01); *H05K 7/1402* (2013.01); *H05K 7/1445* (2013.01); *H05K 7/20536* (2013.01); *G06F 1/184* (2013.01); *H05K 1/0203* (2013.01); *H05K 7/20509* (2013.01)

(58) Field of Classification Search
  CPC ... H05K 7/2039–2049; H05K 7/20509; H05K 1/0201–0203; H05K 7/1401–142; H05K 7/1425; H05K 7/1445; G06F 1/184; G06F 1/20
  USPC .................................. 361/704–721, 752–759
  See application file for complete search history.

(56) References Cited

U.S. PATENT DOCUMENTS

| | | | |
|---|---|---|---|
| 6,104,613 A * | 8/2000 | Urda | H05K 7/1461 165/185 |
| 6,421,252 B1 * | 7/2002 | White | H05K 7/1429 174/377 |
| 6,580,616 B2 | 6/2003 | Greenside et al. | |
| 6,608,755 B2 | 8/2003 | Baldwin et al. | |
| 6,646,868 B2 | 11/2003 | Ho et al. | |
| 7,254,025 B2 | 8/2007 | Baldwin, Jr. | |
| 7,304,856 B2 * | 12/2007 | Andretta | H05K 7/1418 361/688 |
| 8,054,645 B2 * | 11/2011 | Ikeda | H05K 7/1461 361/802 |

* cited by examiner

*Primary Examiner* — Zachary Pape
(74) *Attorney, Agent, or Firm* — Kinney & Lange, P.A.

(57) ABSTRACT

An integrated adapter configured to hold two first circuit card assemblies in a larger second circuit card assembly space includes a thermally-conductive frame and two vertical thermally-conductive guide rails in the inboard region of the frame front. A channel is formed in each of the two guide rails, extending from the guide rail top to the guide rail bottom on the respective outboard side, thereby defining a front rail and a back rail, each configured to receive and support an edge of a first circuit card assembly, and the frame is configured to be attached to a second circuit card assembly, thereby forming an integrated adapter circuit card. Various circuit card sizes can be adapted for use, including supporting two 3U circuit cards in a 6U circuit card space. A method of making the integrated adapter is also disclosed.

20 Claims, 5 Drawing Sheets

INTEGRATED CARD-GUIDE ADAPTER HEAT SINK

BACKGROUND

The present disclosure relates to apparatus for mounting and cooling computer circuit card assemblies, and more particularly, to a card guide heat sink that adapts one or more circuit card assemblies into a larger form factor VITA-compliant rack.

The VITA computer bus standard establishes a protocol for Versa Module Europa (VME) bus-based systems. Also known as the VME International Trade Association (VITA)-46 American National Standards Institute (ANSI) standard, the VITA standard supports VME and Peripheral Component Interconnect (PCI) circuit card assemblies in a range of form factors including 3U, 6U, and 9U. A computer system can typically consist of a rack enclosure that accommodates circuit card assemblies of a specified size (e.g., 6U, to accommodate 233 mm×160 mm circuit card assemblies). It can be beneficial to accommodate either one or two smaller circuit card assemblies (e.g., 3U, 100 mm×160 mm circuit card assemblies) into the larger space, while also providing physical support for the smaller circuit card assemblies. During operation, circuit card assemblies can generate heat that must be removed by the use of heat sinks and the like. Adapters have been developed to achieve the goal of mounting one or two 3U circuit card assemblies in a 6U rack space. For example, U.S. Pat. No. 6,580,616, to Greenside, discloses a circuit board slot adapted for selectively housing either a full vertical height circuit board or at least one smaller vertical height circuit board. Adapters have also been developed to achieve the goal of mounting two 3U circuit card assemblies in a 6U rack space while also providing heat removal. For example, U.S. Pat. No. 7,254,025, to Baldwin, discloses an apparatus that includes a first circuit module coupled to a second circuit module by an adapter, with the first module including a thermally conductive pathway that conducts heat to an edge.

SUMMARY

An integrated adapter configured to hold two first circuit card assemblies in a second circuit card assembly space includes a thermally-conductive frame defining a front, a back, a top, a bottom, a left side, a right side, and an inboard region; and two vertical thermally-conductive guide rails disposed on the front of the thermally-conductive frame in the inboard region, each of the two thermally-conductive guide rails defining a guide rail top, a guide rail bottom, an inboard side, and an outboard side. A channel is formed in each of the two thermally-conductive guide rails, extending from the guide rail top to the guide rail bottom on the respective outboard side, thereby defining a front rail and a back rail. The front rail and back rail on each of the two thermally-conductive guide rails together are configured to receive and support an edge of a first circuit card assembly, the thermally-conductive frame is configured to be matably attached to a second circuit card assembly, thereby forming an integrated adapter circuit card, the integrated adapter circuit card is configured to be positioned in the second circuit card assembly space, and the second circuit card assembly is larger than the first circuit card assembly.

A method of making an integrated adapter configured to hold two first circuit card assemblies in a second circuit card assembly space includes the steps of forming a thermally-conductive frame defining a front, a back, a top, a bottom, a left side, a right side, and an inboard region, where the thermally-conductive frame is configured to be matably attached to a second circuit card assembly thereby forming an integrated adapter circuit card, and the integrated adapter circuit card is configured to be positioned in the second circuit card assembly space; forming two thermally-conductive guide rails, each defining a guide rail top, a guide rail bottom, an inboard side, and an outboard side, where a channel is formed in each of the two thermally-conductive guide rails, extending from the guide rail top to the guide rail bottom on the respective outboard side, thereby defining a front rail and a back rail, and where the front rail and back rail on each of the two thermally-conductive guide rails together are configured to receive and support an edge of a first circuit card assembly; and attaching each of the two thermally-conductive guide rails to the thermally-conductive frame on the front in the inboard region, where the thermally-conductive frame is configured to be matably attached to a second circuit card assembly, thereby forming an integrated adapter circuit card, the integrated adapter circuit card is configured to be positioned in the second circuit card assembly space, and the second circuit card assembly is larger than the first circuit card assembly.

DETAILED DESCRIPTION

Figure 1:
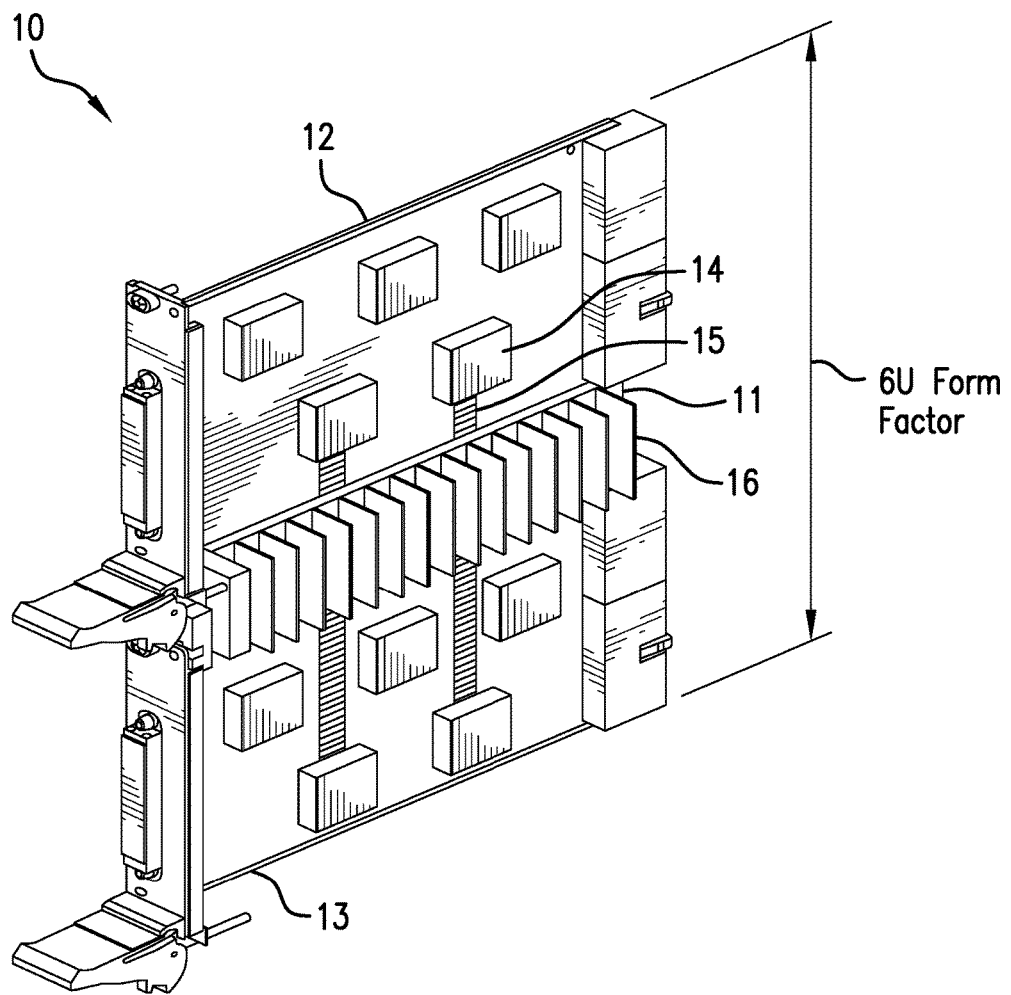
FIG. 1 is a perspective side view of a two-card adapter apparatus of the prior art.

FIG. 1 is a perspective side view of a two-card adapter apparatus of the prior art. Shown in FIG. 1 are adapter apparatus 10, adapter 11, first card 12, second card 13, computer chips 14, thermally conductive pathways 15, and fins 16. Adapter apparatus 10 is adapted for configuring two 3U circuit card assemblies in a 6U circuit card assembly rack space by using adapter 11 along with additional components and fasteners (not shown) to couple first card 12 to second card 13. Computer chips 14 can produce heat during operation which is conducted away from computer chips 14 by associated thermally conductive pathway 15 to fins 16 which dissipate the heat.

Figure 2A:
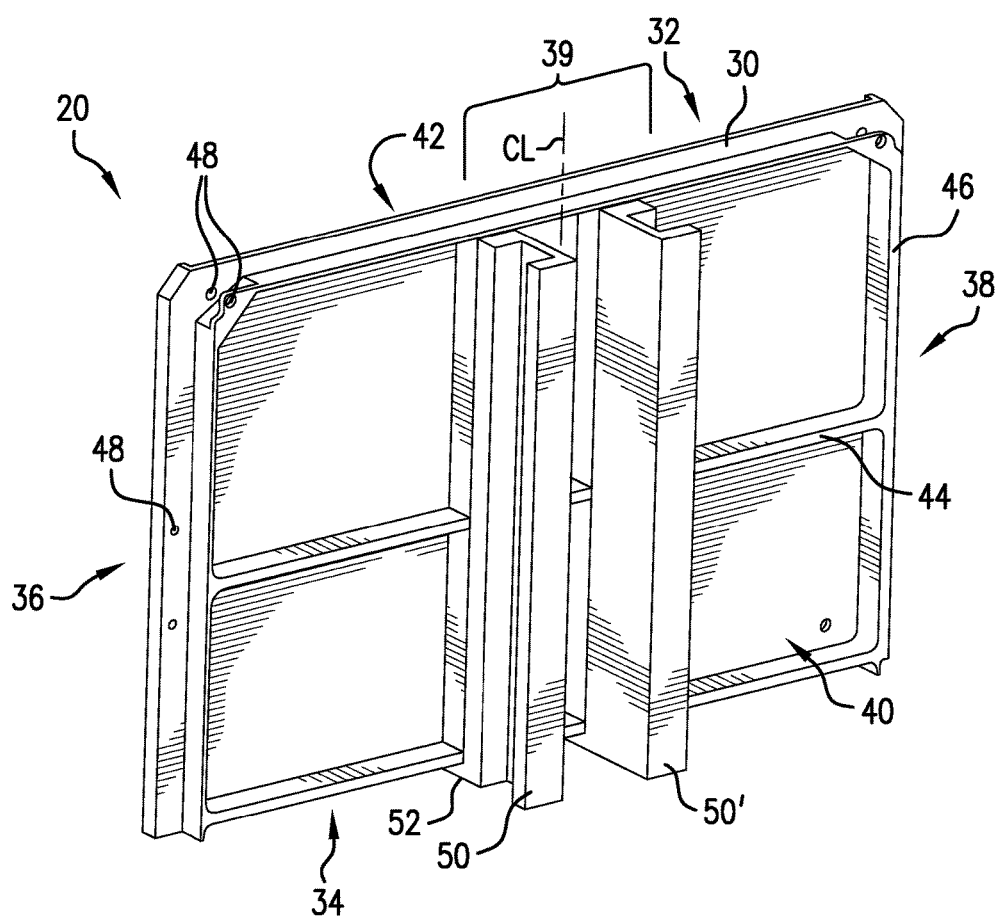
FIG. 2A is a perspective front view of a heat sink adapter of the present disclosure.
Figure 2B:
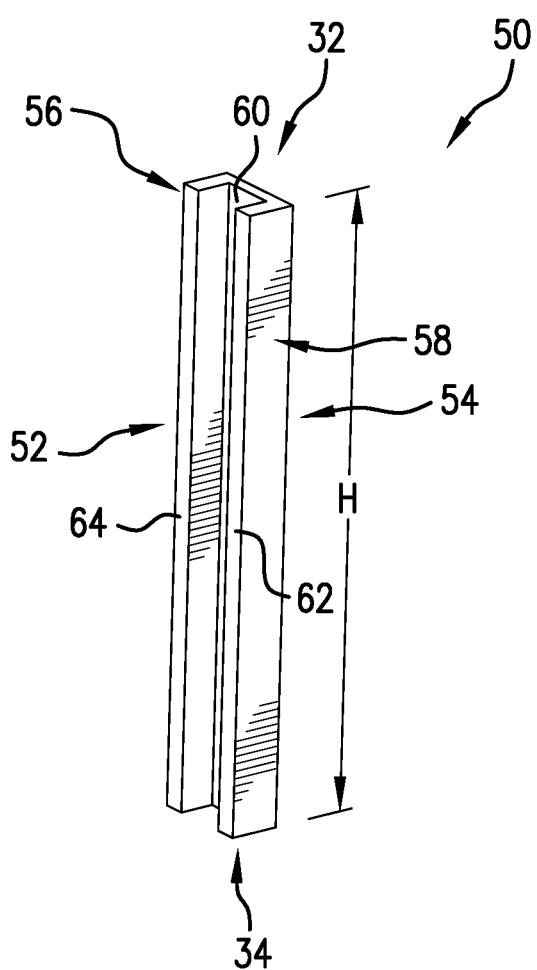
FIG. 2B is a perspective front view of the guide rail of the heat sink adapter of FIG. 2A.
Figure 2C:
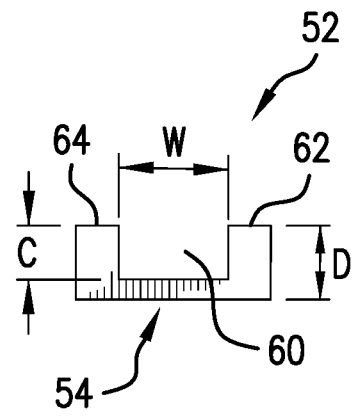
FIG. 2C is a bottom view of the guide rail of FIG. 2B.

FIG. 2A is a perspective front view of a heat sink adapter according to the present disclosure, FIG. 2B is a perspective front view of the guide rail of the heat sink adapter of FIG. 2A, and FIG. 2C is a bottom view of the guide rail of FIG. 2B. Shown in FIGS. 2A-2C are integrated adapter 20, frame 30, top 32, bottom 34, left side 36, right side 38, centerline $C_L$, inboard region 39, front 40, back 42, stiffeners 44, ribs 46, apertures 48, guide rails 50, 50', outboard side 52, inboard side 54, guide rail back 56, guide rail front 58, channel 60, front rail 62, and back rail 64. In the illustrated embodiment, integrated adapter 20 includes frame 30 and two guide rails 50, 50'. FIG. 2A depicts an arbitrary spatial orientation of integrated adapter 20, with frame 30 having fundamentally a box-like geometry with several spatial features assisting in describing integrated adapter 20. Therefore, top 32, bottom 34, left side 36, right side 38, inboard region 39, front 40, and back 42 describe the fundamental regions of frame 30. Top 32 and bottom 34 also refer to guide rails 50, 50'. Inboard region 39 describes a vertically-oriented central region of frame 30 with respect to left side 36 and right side 38 (i.e., a central region near centerline $C_L$).

In the illustrated embodiment, frame 30 includes stiffeners 44, which provide mechanical support to frame 30, and can also provide structural stiffening, thereby reducing or suppressing vibrations. In some embodiments, frame 30 can include a greater number of stiffeners 44 than is shown in FIG. 2A. In other embodiments, stiffeners 44 can have different sizes, placement, and/or orientations than is shown in FIG. 2A. In yet other embodiments, frame 30 can include fewer than the number of stiffeners 44 shown in FIG. 2A. In some of these other embodiments, there can be no stiffeners 44 on frame 30.

In the illustrated embodiment, frame 30 includes ribs 46 which provide mechanical support for integrated adapter 20 when mounting integrated adapter 20 in a computer chassis (not shown in FIGS. 2A-2C). As will be described later in FIGS. 4A-4B, ribs 46 can also assist in conducting heat from backplane 20 to a computer chassis. Ribs 46 can also provide structural stiffening, thereby reducing or suppressing vibrations in integrated adapter 20. In some embodiments, frame 30 can include a greater number of ribs 46 than is shown in FIG. 2A. In yet other embodiments, frame 30 can include fewer than the number of ribs 46 shown in FIG. 2A. In some of these other embodiments, there can be no ribs 46 on frame 30. In other embodiments, ribs 46 can have different sizes, placement, and/or orientations than is shown in FIG. 2A.

Referring again to FIG. 2A, stiffeners 44 and ribs 46 can work together to provide structural stiffening and/or structural support for frame 30. In some embodiments, structural stiffening is beneficial in reducing or suppressing vibrations in frame 30, and accordingly, in integrated adapter 20. In a particular embodiment, the design and configuration of stiffeners 44 and/or ribs 46 can be based on several factors including without limitation the material from which frame 30 is made, the physical size of frame 30 (i.e., the form factor of the enclosure so designed), the weight of the circuit card assemblies (not shown in FIG. 2A) to be supported by integrated adapter 20, and the physical environment in which integrated adapter 20 can be used. In a particular embodiment, integrated adapter 20 can be used in an airborne computer system (not shown), whereby structural vibrations associated with engines, rotors, and the like can be transmitted to integrated adapter 20. In this particular embodiment, the need for vibration dampening can influence the design and configuration of stiffeners 44 and/or ribs 46.

Integrated adapter 20 includes two guide rails 50, 50' that are positioned symmetrically opposite each other in inboard region 39 on front 40 of frame 30. Guide rails 50, 50' each have outboard side 52 facing toward the respective side of frame 30 (i.e., guide rail 50 has outboard side 52 facing toward left side 36, and guide rail 50' has outboard side 52 facing toward right side 38). In a similar manner, each guide rail 50, 50' has inboard side 54 facing inward (i.e., in a direction opposite to that of outboard side 52). Guide rails 50, 50' are attached to frame 30. In the illustrated embodiment, guide rails 50, 50' are metallurgically joined to frame 30. Non-limiting examples of metallurgical joining include welding and brazing. In some embodiments, guide rails 50, 50' and frame 30 are made from a solid piece of material. In other embodiments, guide rails 50, 50' are attached to frame 30 by mechanical fasteners. Non-limiting examples of mechanical fasteners include threaded fasteners, rivets, and the like. In yet other embodiments, other means of mechanical fastening can be used to attach guide rails 50, 50' to frame 30, with non-limiting examples including interference fit, epoxy, and other forms of adhesives.

Referring to FIGS. 2B-2C, guide rail 50 will be described in detail, with the description also applying to symmetrically-opposite guide rail 50'. Guide rail 50 can described in terms of several spatial features that assist in describing integrated adapter 20. Therefore, top 32, bottom 34, outboard side 52, inboard side 54, guide rail back 56, and guide rail front 58 refer to the spatial regions of guide rail 50. Guide rail 50 has height H and guide rail depth D. Channel 60 is on outboard side 52 of guide rail 50, extending along height H of guide rail 50 from top 32 to bottom 34, thereby resulting in a top-view cross-sectional shape that resembles a "U". Guide rail 50 can also be referred to as a "U-rail", or a "U-channel". Channel 60 has channel width W and channel depth C, resulting in front rail 62 and back rail 64. As will be described later in FIGS. 4A-4B, front rail 62 and back rail 64 can help support a circuit card assembly (not shown in FIGS. 2A-2C) in integrated adapter 20.

In the illustrated embodiment, integrated adapter 20 is made from a metal or metal alloy. Non-limiting examples of metallic materials that can be used include nickel, aluminum, titanium, copper, iron, cobalt, silver, and all alloys that include these various metals. In some embodiments, various alloys of aluminum can be used to make integrated adapter 20. In a particular embodiment, aluminum alloy 6061 can be used to make integrated adapter 20. In the illustrated embodiment, various manufacturing methods can be used to make integrated adapter 20, with manufacturing methods including without limitation extrusion, forging, subtractive manufacturing, casting, molding, and combinations of these methods. In other embodiments, integrated adapter 20 can be made by additive manufacturing and/or hybrid additive subtractive manufacturing processes. In some embodiments, frame 30 can be made from metals, metal alloys, metal oxides, ceramics, fibers, composites, and other materials.

Integrated adapter 20 assists in providing thermal management (i.e., heat removal, thermal isolation) from circuit card assemblies (not shown in FIGS. 2A-2C). Accordingly, integrated adapter 20 can be made from a material or materials that have various thermal conductivity (k) values dependent on the thermal management needs of the particular design. In the illustrated embodiment, integrated adapter 20 is made from an alloy having thermal conductivity greater than about 80 W/m-K. In some embodiments, integrated adapter 20 is made from a material having thermal conductivity between about 100-350 W/m-K, with aluminum alloy 6061 being an exemplary material. In other embodiments, integrated adapter 20 is made from a material having thermal conductivity less than 80 W/m-K or greater than about 350 W/m-K. In some embodiments, frame 30 and guide rails 50 can be made of different materials. For example, in an embodiment, frame 30 can be made of an aluminum alloy and guide rails 50 can be made of a composite material. In one of these embodiments, guide rails 50 can be made of a material having a thermal conductivity less than the thermal conductivity of frame 30. In another of these embodiments, guide rails 50 can be made of a material having a thermal conductivity greater than the thermal conductivity of frame 30.

Referring again to FIG. 2A, frame 30 has several apertures 48 that can be used for assisting in mounting integrated adapter 20 within an enclosure (not shown in FIG. 2A). In the illustrated embodiment, apertures 48 are through holes or threaded features, so as to accommodate roll pins or threaded fasteners (not shown in FIG. 2A). In some embodiments, a different configuration (i.e., size, location, number) of apertures 48 can be on integrated adapter 20. In other embodiments, frame 30 can have no apertures 48.

As will be described later in FIGS. 4A-4B, integrated adapter 20 is configured to fit into a computer chassis. Accordingly, the physical dimensions of integrated adapter 20, frame 30, and guide rails 50, 50' can be established to accommodate a computer chassis. An exemplary computer chassis is a 6U form factor chassis that accommodates a VITA computer bus standard (i.e., VITA-46). The 6U form factor is known in the computer arts as having an ANSI standardized circuit card assembly measuring 233 mm×160 mm. Accordingly, in the illustrated embodiment, frame 30 is approximately 233 mm×160 mm (i.e., 6U form factor). In other embodiments, frame 30 can have a size that larger than these exemplary dimensions. In one of these other embodiments, frame 30 can have a 9U form factor.

Figure 3A:
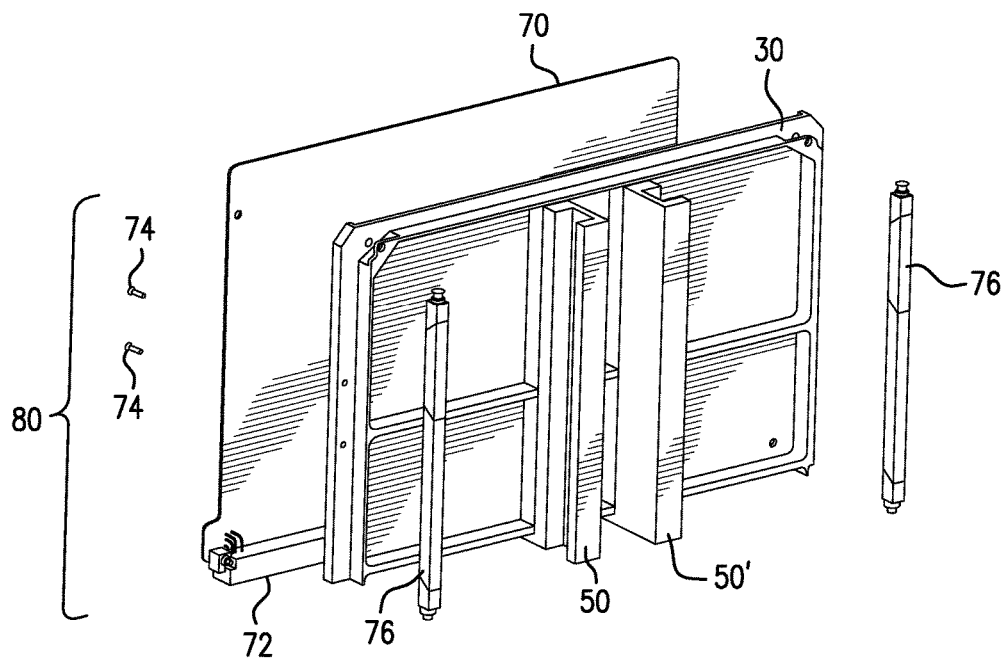
FIG. 3A is an exploded view of an integrated adapter circuit card assembly.
Figure 3B:
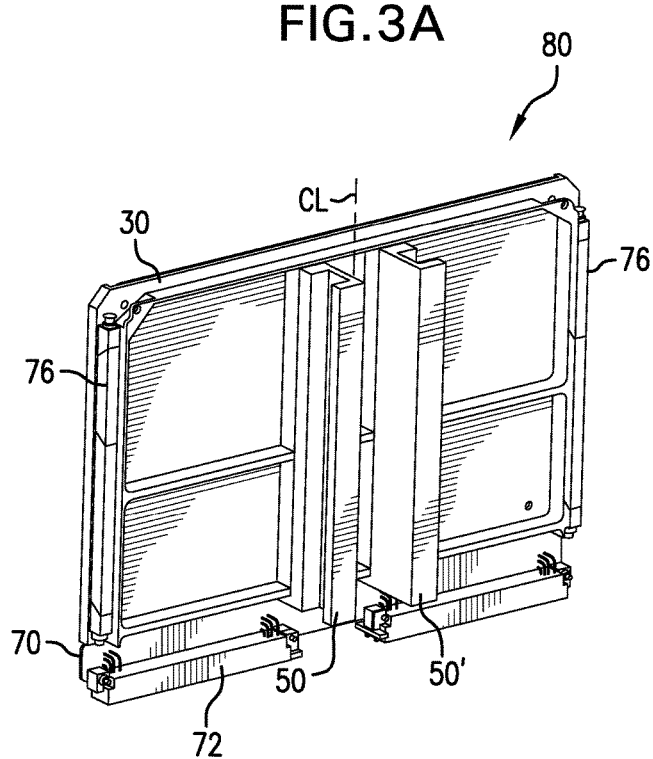
FIG. 3B is a perspective view of the integrated adapter circuit card of FIG. 3A.

FIG. 3A is an exploded view of an integrated adapter circuit card assembly. FIG. 3B is a perspective view of the integrated adapter circuit card assembly of FIG. 3A (i.e., the components shown in FIG. 3A assembled together). Shown in FIGS. 3A-3B are integrated adapter 20, 6U circuit card 70, electrical connector 72, threaded fasteners 74, locking posts 76, and integrated adapter circuit card assembly 80. 6U circuit card 70 includes electrical connector 72, and has a form factor that can be inserted into a 6U form factor chassis (not shown in FIGS. 3A-3B). 6U circuit card 70 is attached to integrated adapter 20 by means of threaded fasteners 74 which are configured to engage with apertures 48. Locking posts 76 can be used for positioning circuit card assemblies (not shown) in a 6U form factor chassis. As explained above with respect to FIG. 2A, some embodiments of integrated adapter 20 can have a different configuration of apertures 48. In these other embodiments, 6U circuit card 70 and threaded fasteners 74 can be configured to be compatible with the respective configuration of apertures 48.

Figure 4A:
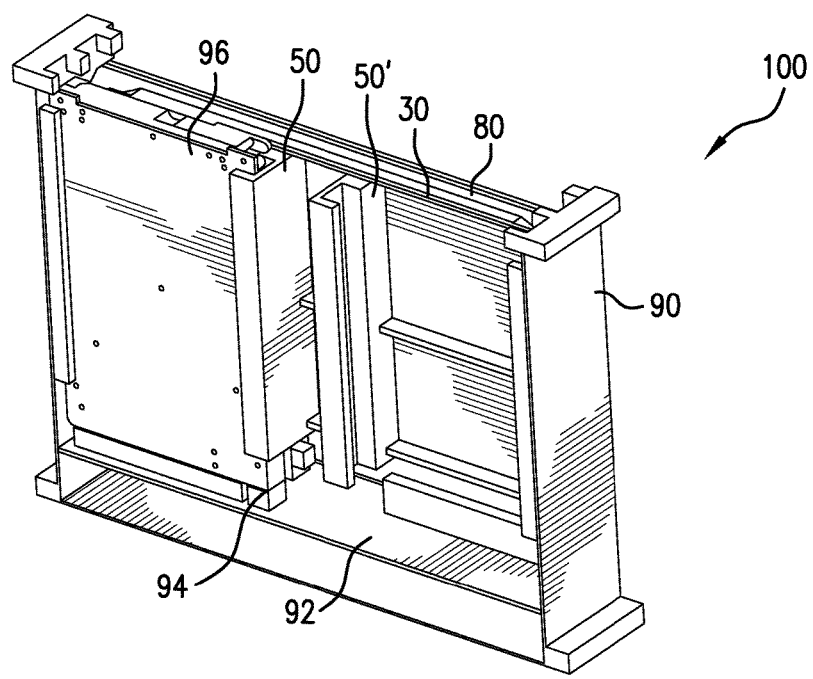
FIG. 4A is a perspective view of a 3U circuit card assembly in the heat sink adapter in a 6U chassis.

FIG. 4A is a perspective view of a 3U circuit card assembly in the heat sink adapter in a 6U chassis. FIG. 4B is a top view of the 3U circuit card assembly in the heat sink adapter in a 6U chassis of FIG. 4A. Shown in FIGS. 4A-4B are integrated adapter 20, channel 60, integrated adapter circuit card assembly 80, chassis 90, motherboard 92, daughterboard 94, 3U circuit card assembly 96, chassis rail 98, exemplary configuration 100, and centerline $C_L$. Centerline $C_L$ shown in FIG. 4B corresponds to centerline $C_L$ of integrated adapter 20 as shown in FIG. 2A. Chassis 90 includes several chassis rails 98, each configured to provide alignment and support to an associated circuit card assembly. In the illustrated embodiment, chassis 90 is made from a metal or metal alloy, thereby being capable of conducting heat from various circuit card assemblies. In some embodiments, chassis 90 can include heat dissipative fins (not shown) on the exterior. In other embodiments, chassis 90 can be connected to a convective heat removal system (not shown) which can circulate a fluid (i.e., air, gas, and/or liquid) that can remove heat from chassis 90.

Referring again to FIGS. 4A-4B, chassis 90 is exemplary of a 6U form factor computer chassis that is configured to accommodate 6U circuit card assemblies. Motherboard 92 is attached to chassis 90. Several daughterboards 94 are located on motherboard 92, each daughterboard 94 configured to provide electrical connections to an associated circuit card assembly. Those who are skilled in the computer hardware arts are familiar with computer motherboards which are configured to accommodate the VITA computer bus standard (i.e., VME and/or VITA-46 bus standard). Exemplary configuration 100 includes integrated adapter circuit card assembly 80 installed in computer chassis 90, supporting a single 3U circuit card assembly 96. In some embodiments, exemplary configuration 100 can accommodate two 3U circuit card assemblies 96. In other embodiments, there can be no 3U circuit card assemblies 96 in exemplary configuration 100. It is to be noted that integrated adapter 20 (and accordingly, integrated adapter circuit card assembly 80) is not dependent on the installation of one or more 3U circuit card assemblies 96.

As explained above in regard to FIGS. 3A-3B, integrated adapter circuit card assembly 80 includes integrated adapter 20. Therefore, in some embodiments, computer chassis 90 can accommodate more than a single integrated adapter 20. In some of these embodiments, the number of integrated adapters 20 being accommodated in computer chassis 90 is only limited by the physical size of a particular computer chassis 90. It is to be noted that in a particular embodiment where multiple integrated adapters 20 are being used, each of the multiple integrated adapters 20 can be individually configured to accommodate either zero, one, or two 3U circuit card assemblies 96.

As described above with respect to FIGS. 3A-3B, integrated adapter circuit card assembly 80 includes integrated adapter 20, 6U circuit card assembly 70, and associated locking posts 76. In the embodiment shown in FIGS. 4A-4B, a single 3U circuit card assembly 96 is installed in chassis 90, being accommodated by integrated adapter 20. Channel 60 of guide rail 50 of integrated adapter 20 is configured to hold the inboard edge of 3U circuit card assembly 96, with a corresponding chassis rail 98 being configured to hold the outboard edge of 3U circuit card assembly 96. During operation of 3U circuit card assembly 96, it can be desirable to remove internally-produced heat away from 3U circuit card assembly 96. 3U circuit card assembly 96 is in physical contact with chassis rail 98, because chassis rail 98 is configured to accommodate the physical dimensions of 3U circuit card assembly 96. Accordingly, heat produced internally by 3U circuit card assembly 96 is transferred to chassis 90 by thermal conduction.

3U circuit card assembly 96 is also in physical contact with a corresponding channel 60 of a corresponding guide rail 50, because channel 60 is configured to accommodate the physical dimensions of 3U circuit card assembly 96. Accordingly, heat produced internally by 3U circuit card assembly 96 is also transferred to guide rail 50 by thermal conduction. Guide rail 50 is attached to frame 30, which is in physical contact with chassis rail 98 of chassis 90. Ribs (not shown in FIGS. 4A-4B) can further assist in transferring heat from frame 30 to chassis 90. Accordingly, heat produced internally by 3U circuit card assembly 96 is also transferred through a corresponding guide rail 50, through frame 30, into chassis 90 by thermal conduction.

Figure 4B:
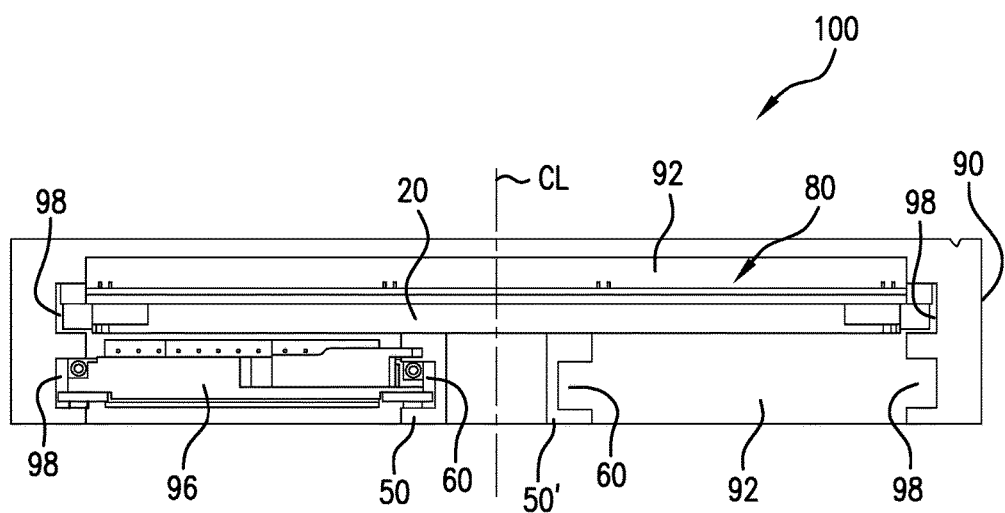
FIG. 4B is a top view of the 3U circuit card assembly in the heat sink adapter in a 6U chassis of FIG. 4A.

In the exemplary embodiment shown in FIGS. 4A-4B, a single 3U circuit card assembly 96 is installed via integrated adapter 20 in chassis 90. During operation of 3U circuit card assembly 96, internally-produced heat can be transferred across backplane 20 to both sides of chassis 90, thereby providing for heat removal from 3U circuit card assembly

96. As described above in respect to FIGS. 2A-2C, integrated adapter 20 can be made from a material having a thermal conductivity value that can assist providing thermal management while also providing structural support for 3U circuit card assembly 96.

In some embodiments, two 3U circuit card assemblies 96 can be installed via integrated adapter 20 in chassis 90. In these other embodiments, integrated adapter 20 can provide thermal management of internally-produced heat from either or both 3U circuit card assemblies 96. Accordingly, integrated adapter 20 can provide versatility in configuration a computer hardware system (not shown) within chassis 90 by providing both physical support of and thermal management of a single 3U circuit card assembly 96 in either location. Moreover, integrated adapter 20 can also provide physical support of and thermal management of two 3U circuit card assemblies 96 in both locations.

The exemplary embodiments illustrated and described in the present disclosure show the installation of either one or two 3U circuit card assemblies 96 in chassis 90, with chassis 90 having a 6U form factor. The scope of the present disclosure includes all other embodiments of integrated adapter 20 for use in adapting one or more circuit card assemblies for use in a chassis having a form factor that is larger than any of the circuit card assemblies. As a non-limiting example, a 9U form factor chassis (not shown) can be used for a computer system. Accordingly, integrated adapter 20 can be configured to accommodate one, two, or three 3U circuit card assemblies 96 in the exemplary 9U form factor chassis. In a different embodiment for use in the exemplary 9U form factor chassis, integrated adapter 20 can be configured to accommodate a single 6U circuit card assembly (not shown) and a single 3U circuit card assembly 96 in the 9U form factor chassis. In yet a different embodiment for use in the exemplary 9U form factor chassis, integrated adapter 20 can be configured to accommodate a single 6U circuit card assembly (not shown) in the 9U form factor chassis.

As explained above in regard to FIGS. 2A-2C, the exemplary embodiment of integrated adapter 20 in the present disclosure applies to a 6U form factor computer chassis. All computer form factor chassis are within the scope of the present disclosure. For example, form factors ranging from 1U to 9U are known in the computer arts. Other computer form factor chassis are also within the scope of the present disclosure.

DISCUSSION OF POSSIBLE EMBODIMENTS

The following are non-exclusive descriptions of possible embodiments of the present invention.

An integrated adapter configured to hold two first circuit card assemblies in a second circuit card assembly space, comprising: a thermally-conductive frame defining a front, a back, a top, a bottom, a left side, a right side, and an inboard region; and two vertical thermally-conductive guide rails disposed on the front of the thermally-conductive frame in the inboard region, each of the two thermally-conductive guide rails defining a guide rail top, a guide rail bottom, an inboard side, and an outboard side; wherein: a channel is formed in each of the two thermally-conductive guide rails, extending from the guide rail top to the guide rail bottom on the respective outboard side, thereby defining a front rail and a back rail; the front rail and back rail on each of the two thermally-conductive guide rails together are configured to receive and support an edge of a first circuit card assembly; the thermally-conductive frame is configured to be matably attached to a second circuit card assembly, thereby forming an integrated adapter circuit card; the integrated adapter circuit card is configured to be positioned in the second circuit card assembly space; and the second circuit card assembly is larger than the first circuit card assembly.

The integrated adapter of the preceding paragraph can optionally include, additionally and/or alternatively, any one or more of the following features, configurations and/or additional components:

A further embodiment of the foregoing integrated adapter, wherein: the first circuit card assembly comprises a 3U form factor; and the second circuit card assembly comprises a 6U form factor.

A further embodiment of the foregoing integrated adapter, wherein: the first circuit card assembly comprises a form factor selected from the group consisting of a 3U form factor and a 6U form factor; and the second circuit card assembly comprises a 9U form factor.

A further embodiment of the foregoing integrated adapter, wherein the thermally-conductive frame comprises one or more of nickel, aluminum, titanium, copper, iron, cobalt, and alloys thereof.

A further embodiment of the foregoing integrated adapter, wherein the thermally-conductive frame comprises 6061 aluminum alloy.

A further embodiment of the foregoing integrated adapter, wherein the thermally-conductive frame is formed by one or more of extrusion, forging, additive manufacturing, subtractive manufacturing, and casting.

A further embodiment of the foregoing integrated adapter, wherein: each of the thermally-conductive guide rails are formed by one or more of extrusion, forging, additive manufacturing, subtractive manufacturing, casting, and molding; and each of the thermally-conductive guide rails comprises one or more of nickel, aluminum, titanium, copper, iron, cobalt, and alloys thereof.

A further embodiment of the foregoing integrated adapter, wherein the integrated adapter is formed as a single component.

A further embodiment of the foregoing integrated adapter, wherein: the thermally-conductive frame is formed as a single component; each of the thermally-conductive guide rails is formed as a single component; and each of the thermally-conductive guide rails is matably attached to the thermally-conductive frame by one or more of welding, brazing, threaded fasteners, rivets, interference fit, or an adhesive.

A further embodiment of the foregoing integrated adapter, wherein: the thermally-conductive frame is formed as a single component; each of the thermally-conductive guide rails is formed as a single component; the thermally-conductive frame comprises one or more of nickel, aluminum, titanium, copper, iron, cobalt, and alloys thereof; each of the thermally-conductive guide rails comprises a non-metallic material; and each of the thermally-conductive guide rails is matably attached to the thermally-conductive frame by one or more of threaded fasteners, rivets, interference fit, and an adhesive.

A further embodiment of the foregoing integrated adapter, wherein: the thermally-conductive frame comprises a material having a first thermal conductivity ranging from 80-350 W/m-K; each of the two thermally-conductive guide rails comprises a material having a second thermal conductivity; and the first thermal conductivity is greater than the second thermal conductivity.

A method of making an integrated adapter configured to hold two first circuit card assemblies in a second circuit card assembly space, comprising the steps of: forming a thermally-conductive frame defining a front, a back, a top, a bottom, a left side, a right side, and an inboard region; wherein: the thermally-conductive frame is configured to be matably attached to a second circuit card assembly, thereby forming an integrated adapter circuit card; and the integrated adapter circuit card is configured to be positioned in the second circuit card assembly space; forming two thermally-conductive guide rails, each defining a guide rail top, a guide rail bottom, an inboard side, and an outboard side; wherein: a channel is formed in each of the two thermally-conductive guide rails, extending from the guide rail top to the guide rail bottom on the respective outboard side, thereby defining a front rail and a back rail; and the front rail and back rail on each of the two thermally-conductive guide rails together are configured to receive and support an edge of a first circuit card assembly; and attaching each of the two thermally-conductive guide rails to the thermally-conductive frame on the front in the inboard region; wherein: the thermally-conductive frame is configured to be matably attached to a second circuit card assembly, thereby forming an integrated adapter circuit card; the integrated adapter circuit card is configured to be positioned in the second circuit card assembly space; and the second circuit card assembly is larger than the first circuit card assembly.

The method of the preceding paragraph can optionally include, additionally and/or alternatively, any one or more of the following features, configurations and/or additional components:

A further embodiment of the foregoing method, wherein: the first circuit card assembly comprises a 3U form factor; and the second circuit card assembly comprises a 6U form factor.

A further embodiment of the foregoing method, wherein: the first circuit card assembly comprises a form factor selected from the group consisting of 3U form factor and 6U form factor; and the second circuit card assembly comprises a 9U form factor.

A further embodiment of the foregoing method wherein the thermally-conductive frame comprises one or more of nickel, aluminum, titanium, copper, iron, cobalt, and alloys thereof A further embodiment of the foregoing method, wherein the thermally-conductive frame comprises 6061 aluminum alloy.

A further embodiment of the foregoing method, wherein the thermally-conductive frame is formed by one or more of extrusion, forging, additive manufacturing, subtractive manufacturing, and casting.

A further embodiment of the foregoing method, wherein: each of the thermally-conductive guide rails are formed by one or more of extrusion, forging, additive manufacturing, subtractive manufacturing, casting, and molding; and each of the thermally-conductive guide rails comprises one or more of nickel, aluminum, titanium, copper, iron, cobalt, and alloys thereof.

A further embodiment of the foregoing method, wherein: the thermally-conductive frame is formed as a single component; each of the thermally-conductive guide rails are formed as a single component; the thermally-conductive frame comprises one or more of nickel, aluminum, titanium, copper, iron, cobalt, and alloys thereof; each of the thermally-conductive guide rails comprises a non-metallic material; and each of the thermally-conductive guide rails is matably attached to the thermally-conductive frame by one or more of threaded fasteners, rivets, interference fit, or an adhesive.

A further embodiment of the foregoing method, wherein: the thermally-conductive frame comprises a material having a first thermal conductivity ranging from 80-350 W/m-K; each of the two thermally-conductive guide rails comprises a material having a second thermal conductivity; and the first thermal conductivity is greater than the second thermal conductivity.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An integrated adapter configured to hold two first circuit card assemblies in a second circuit card assembly space, comprising:
    a thermally-conductive frame defining a front, a back, a top, a bottom, a left side, a right side, and an inboard region; and
    two vertical thermally-conductive guide rails disposed on the front of the thermally-conductive frame in the inboard region, each of the two thermally-conductive guide rails defining a guide rail top, a guide rail bottom, an inboard side, and an outboard side;
    wherein:
        a channel is formed in each of the two thermally-conductive guide rails, extending from the guide rail top to the guide rail bottom on the respective outboard side, thereby defining a front rail and a back rail;
        the front rail and back rail on each of the two thermally-conductive guide rails together are configured to receive and support an edge of a first circuit card assembly;
        the thermally-conductive frame is configured to be matably attached to a second circuit card assembly, thereby forming an integrated adapter circuit card;
        the integrated adapter circuit card is configured to be positioned in the second circuit card assembly space; and
        the second circuit card assembly is larger than the first circuit card assembly.

2. The integrated adapter of claim 1, wherein:
the first circuit card assembly comprises a 3U form factor; and
the second circuit card assembly comprises a 6U form factor.

3. The integrated adapter of claim 1, wherein:
the first circuit card assembly comprises a form factor selected from the group consisting of a 3U form factor and a 6U form factor; and
the second circuit card assembly comprises a 9U form factor.

4. The integrated adapter of claim 1, wherein the thermally-conductive frame comprises one or more of nickel, aluminum, titanium, copper, iron, cobalt, and alloys thereof.

5. The integrated adapter of claim 1, wherein the thermally-conductive frame comprises 6061 aluminum alloy.

6. The integrated adapter of claim 1, wherein the thermally-conductive frame is formed by one or more of extrusion, forging, additive manufacturing, subtractive manufacturing, and casting.

7. The integrated adapter of claim 1, wherein:
each of the thermally-conductive guide rails are formed by one or more of extrusion, forging, additive manufacturing, subtractive manufacturing, casting, and molding; and
each of the thermally-conductive guide rails comprises one or more of nickel, aluminum, titanium, copper, iron, cobalt, and alloys thereof.

8. The integrated adapter of claim 1, wherein the integrated adapter is formed as a single component.

9. The integrated adapter of claim 1, wherein:
the thermally-conductive frame is formed as a single component;
each of the thermally-conductive guide rails is formed as a single component; and
each of the thermally-conductive guide rails is matably attached to the thermally-conductive frame by one or more of welding, brazing, threaded fasteners, rivets, interference fit, or an adhesive.

10. The integrated adapter of claim 1, wherein:
the thermally-conductive frame is formed as a single component;
each of the thermally-conductive guide rails is formed as a single component;
the thermally-conductive frame comprises one or more of nickel, aluminum, titanium, copper, iron, cobalt, and alloys thereof;
each of the thermally-conductive guide rails comprises a non-metallic material; and
each of the thermally-conductive guide rails is matably attached to the thermally-conductive frame by one or more of threaded fasteners, rivets, interference fit, and an adhesive.

11. The integrated adapter of claim 10, wherein:
the thermally-conductive frame comprises a material having a first thermal conductivity ranging from 80-350 W/m-K;
each of the two thermally-conductive guide rails comprises a material having a second thermal conductivity; and
the first thermal conductivity is greater than the second thermal conductivity.

12. A method of making an integrated adapter configured to hold two first circuit card assemblies in a second circuit card assembly space, comprising the steps of:
forming a thermally-conductive frame defining a front, a back, a top, a bottom, a left side, a right side, and an inboard region;
wherein:
the thermally-conductive frame is configured to be matably attached to a second circuit card assembly, thereby forming an integrated adapter circuit card; and
the integrated adapter circuit card is configured to be positioned in the second circuit card assembly space;
forming two thermally-conductive guide rails, each defining a guide rail top, a guide rail bottom, an inboard side, and an outboard side;
wherein:
a channel is formed in each of the two thermally-conductive guide rails, extending from the guide rail top to the guide rail bottom on the respective outboard side, thereby defining a front rail and a back rail; and
the front rail and back rail on each of the two thermally-conductive guide rails together are configured to receive and support an edge of a first circuit card assembly; and
attaching each of the two thermally-conductive guide rails to the thermally-conductive frame on the front in the inboard region;
wherein:
the thermally-conductive frame is configured to be matably attached to a second circuit card assembly, thereby forming an integrated adapter circuit card;
the integrated adapter circuit card is configured to be positioned in the second circuit card assembly space; and
the second circuit card assembly is larger than the first circuit card assembly.

13. The integrated adapter of claim 12, wherein:
the first circuit card assembly comprises a 3U form factor; and
the second circuit card assembly comprises a 6U form factor.

14. The integrated adapter of claim 12, wherein:
the first circuit card assembly comprises a form factor selected from the group consisting of 3U form factor and 6U form factor; and
the second circuit card assembly comprises a 9U form factor.

15. The integrated adapter of claim 12, wherein the thermally-conductive frame comprises one or more of nickel, aluminum, titanium, copper, iron, cobalt, and alloys thereof.

16. The integrated adapter of claim 12, wherein the thermally-conductive frame comprises 6061 aluminum alloy.

17. The integrated adapter of claim 12, wherein the thermally-conductive frame is formed by one or more of extrusion, forging, additive manufacturing, subtractive manufacturing, and casting.

18. The integrated adapter of claim 12, wherein:
each of the thermally-conductive guide rails are formed by one or more of extrusion, forging, additive manufacturing, subtractive manufacturing, casting, and molding; and
each of the thermally-conductive guide rails comprises one or more of nickel, aluminum, titanium, copper, iron, cobalt, and alloys thereof.

19. The integrated adapter of claim 12, wherein:
the thermally-conductive frame is formed as a single component;
each of the thermally-conductive guide rails are formed as a single component;
the thermally-conductive frame comprises one or more of nickel, aluminum, titanium, copper, iron, cobalt, and alloys thereof;
each of the thermally-conductive guide rails comprises a non-metallic material; and
each of the thermally-conductive guide rails is matably attached to the thermally-conductive frame by one or more of threaded fasteners, rivets, interference fit, or an adhesive.

20. The integrated adapter of claim 19, wherein:
the thermally-conductive frame comprises a material having a first thermal conductivity ranging from 80-350 W/m-K;

each of the two thermally-conductive guide rails comprises a material having a second thermal conductivity; and the first thermal conductivity is greater than the second thermal conductivity.

* * * * *